(12) United States Patent
Park

(10) Patent No.: US 7,612,415 B2
(45) Date of Patent: Nov. 3, 2009

(54) METHOD OF FORMING SEMICONDUCTOR DEVICE

(75) Inventor: Jin-Ha Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 236 days.

(21) Appl. No.: 11/847,052

(22) Filed: Aug. 29, 2007

(65) Prior Publication Data

US 2008/0054367 A1    Mar. 6, 2008

(30) Foreign Application Priority Data

Aug. 31, 2006    (KR) ................ 10-2006-0083920

(51) Int. Cl.
    *H01L 29/94* (2006.01)
(52) U.S. Cl. ............... 257/371; 257/E21.632; 257/E21.644; 257/E27.067; 438/223
(58) Field of Classification Search ........ 257/371, 257/E21.632, E21.644, E27.067; 438/223
    See application file for complete search history.

(56) References Cited

U.S. PATENT DOCUMENTS

| | | | | |
|---|---|---|---|---|
| 6,060,345 | A * | 5/2000 | Hause et al. ........... | 438/199 |
| 6,576,405 | B1 * | 6/2003 | Buffat et al. ........... | 430/322 |
| 6,586,296 | B1 | 7/2003 | Watt | |
| 6,927,002 | B2 * | 8/2005 | Hattori et al. ......... | 430/5 |
| 2004/0023462 | A1 * | 2/2004 | Rotondaro et al. ..... | 438/287 |

* cited by examiner

*Primary Examiner*—Trung Dang
(74) *Attorney, Agent, or Firm*—Sherr & Vaughn, PLLC

(57) ABSTRACT

Embodiments relate to a method of forming a 90 nm semiconductor device, including forming an isolation film within a semiconductor substrate in which a pMOS region and an nMOS region are defined. A first mask is formed to shield the nMOS region by using a DUV photoresist having a thickness of approximately 0.7 to 0.75 μm. Ions are implanted into the pMOS region to form a p type well. A second mask is formed to shield the pMOS region by using a DUV photoresist having a thickness of approximately 0.7 to 0.75 μm. Ions are implanted into the nMOS region to form an n type well. A gate oxide film and a gate is formed over the semiconductor substrate. A low-concentration impurity may be implanted by using the gate as a mask. An LDD region may be formed. A sidewall spacer may be formed over both sidewalls of the gate. A high-concentration impurity is implanted by using the sidewall spacer as a mask, forming a source/drain region.

20 Claims, 4 Drawing Sheets pMOS | nMOS pMOS | nMOS

METHOD OF FORMING SEMICONDUCTOR DEVICE

The present application claims priority under 35 U.S.C. 119 to Korean Patent Application No. 10-2006-0083920 (filed on Aug. 31, 2006), which is hereby incorporated by reference in its entirety.

TECHNICAL FIELD

It is, therefore, an object of the present invention to provide a method of forming a semiconductor device in which DUV PR thickness can be used in a LDD implant PEP process of sub 90 nm or less devices.

BACKGROUND

For the purpose of miniaturization, large capacity and high integration in semiconductor devices, a process of forming a multi-layer metal line for electrically connecting elements may be required after a transistor, bit line, and capacitor, etc. of the semiconductor device are formed. The transistor includes a MOS transistor having a short channel length. In order to prevent the short-channel effect, the source/drain region of the transistor may be formed to have a lightly doped drain (LDD) region and a Heavily Doped Drain (HDD) region. A CMOS device refers to a device having both a pMOS transistor and an nMOS transistor formed on one semiconductor substrate.

Figure 1A:
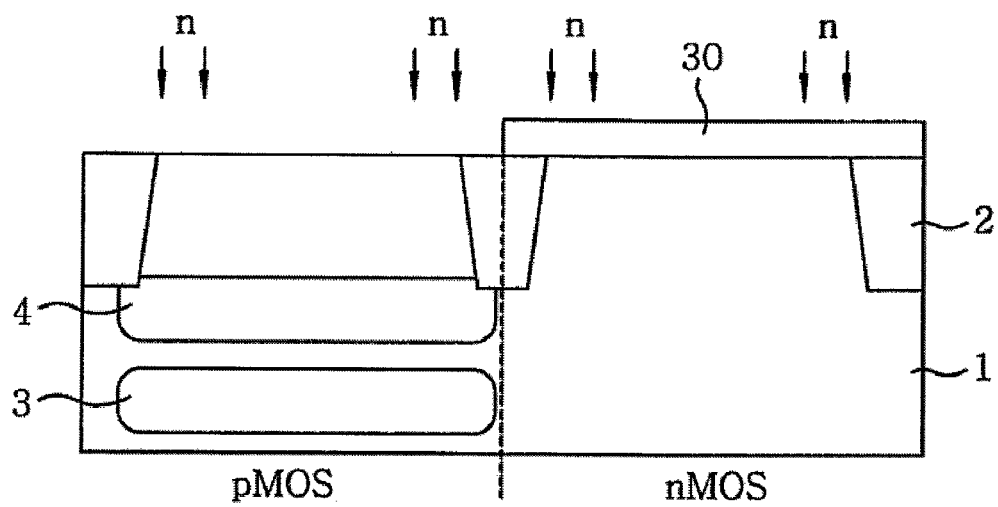
Figure 1B:
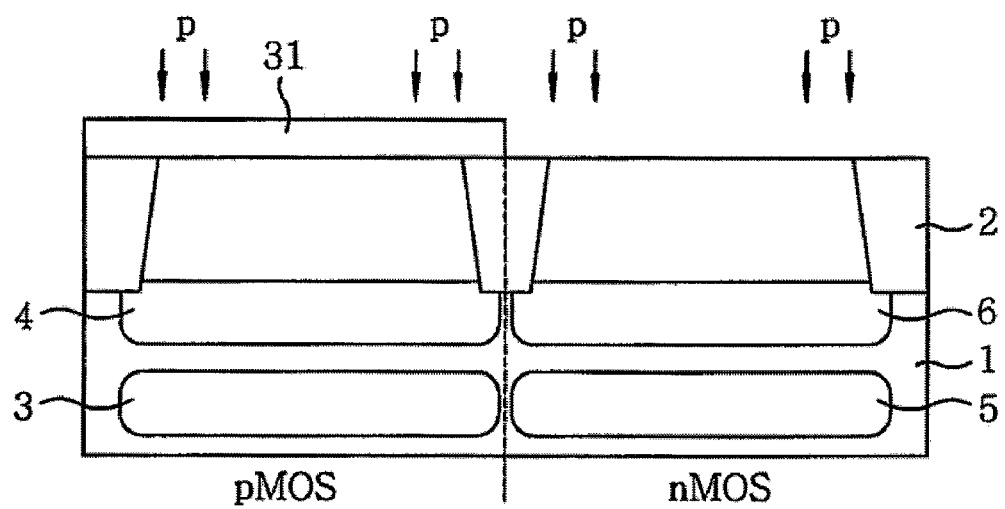

FIGS. 1a and 1b are process cross-sectional views illustrating a related method of forming a 130 nm semiconductor device. Referring to FIG. 1a, Shallow Trench Isolation (STI) regions 2 for isolating elements are formed in a semiconductor substrate 1. The semiconductor substrate 1 is coated with a photoresist which is patterned by exposure and development, forming a first mask 30 through which a pMOS region is opened. Phosphorus (P) or other n type impurity is implanted into the pMOS region to sequentially form an n type well 3 and an n type field stop layer 4. After the first mask 30 is removed, a photoresist is coated again as illustrated in FIG. 1b. The photoresist is patterned by exposure and development to form a second mask 31 through which the nMOS region is opened. A p type impurity is implanted into the exposed nMOS region using the second mask 31, forming a p type well 5 and a p type field stop layer 6. The photoresists may be coated over the first mask 30 and the second mask 31 to a thickness of approximately 0.85 μm to use as a mid ultraviolet (MUV) photoresist (PR) in 130 nm devices.

In the related 130 nm device formed as described above, the photoresist used as an LDD implant mask employs MUV PR having a thickness of 0.85 μm. As the design rules of the LDD implant are adapted for 90 nm processes, the active area of the implant layer (the portion opened to perform the actual implant) is significantly reduced compared with 130 nm devices. PRs used in 90 nm and 130 nm processes cannot be used interchangeably. Previously, there has been no solution to cope with this situation.

SUMMARY

Embodiments relate to a technique of forming semiconductor devices and, more particularly, to a method of forming a semiconductor device, which is suitable for use with a photoresist for a Lightly Doped Drain (LDD) implant, in a device with features at 90 nm or less.

Embodiments relate to a method of forming a semiconductor device in which deep ultraviolet (DUV) PR thickness can be used in a LDD implant photoetching process (PEP) in a device with features at 90 nm or less.

Embodiments relate to a method of forming a semiconductor device in which a DUV PR thickness of approximately 0.7 to 0.75 μm can be used in a LDD implant PEP process in a device with features at 90 nm or less.

Embodiments relate to a method of forming a semiconductor device in which a photoresist having a suitable thickness can be used by substituting several implant conditions in Secondary Ion Mass Spectrometry (SIMS) to apply the DUV PR thickness to the LDD implant PEP process in a device with features at 90 nm or less.

Embodiments relate to a method of forming a 90 nm semiconductor device, including forming an isolation film within a semiconductor substrate in which a pMOS region and an nMOS region are defined. A first mask is formed to shield the nMOS region by using a DUV photoresist having a thickness of approximately 0.7 to 0.75 μm. Ions are implanted into the pMOS region to form a p type well. A second mask is formed to shield the pMOS region by using a DUV photoresist having a thickness of approximately 0.7 to 0.75 μm. Ions are implanted into the nMOS region to form an n type well. A gate oxide film and a gate are formed over the semiconductor substrate. A low-concentration impurity may be implanted by using the gate as a mask. An LDD region may be formed. A sidewall spacer may be formed over both sidewalls of the gate. A high-concentration impurity is implanted by using the sidewall spacer as a mask, forming a source/drain region.

According to embodiments, as the size of devices shift to 90 nm, the PR process also shifts from MUV to DUV. To follow the smaller design rules, a PR thickness suitable for sub 90 nm devices is selected while switching the PR to DUV PR (for highly integrated semiconductor devices such as a 64 MB or larger DRAM).

DRAWINGS

FIGS. 1a and 1b are process cross-sectional views illustrating a related method of forming a 130 nm semiconductor device.

Example FIGS. 2a to 2d are process cross-sectional views illustrating a method of forming a 90 nm semiconductor device according to embodiments.

Figure 3:
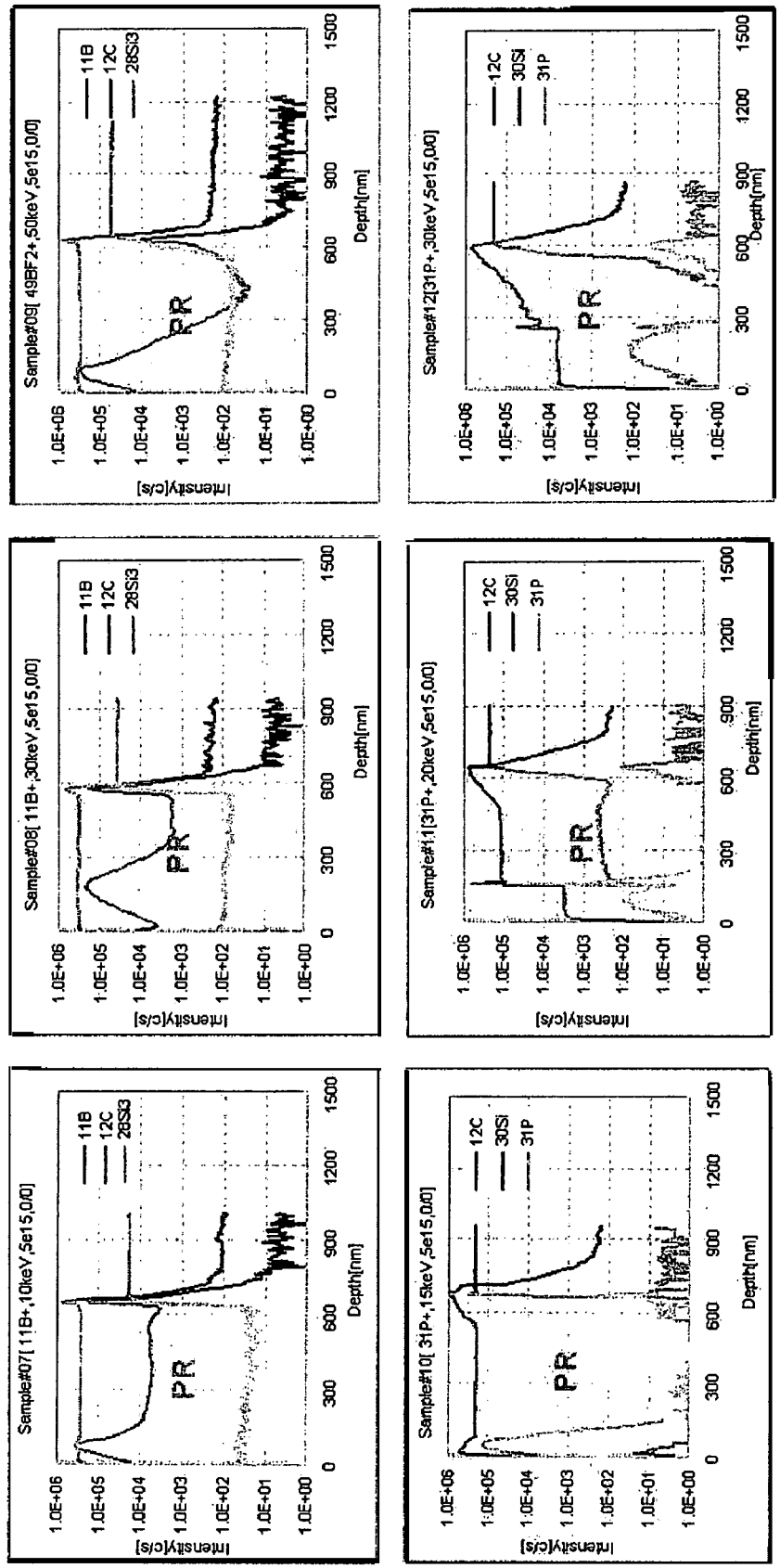

Example FIG. 3 illustrates test SIMS results of implant split according to embodiments.

DESCRIPTION

Figure 2A:
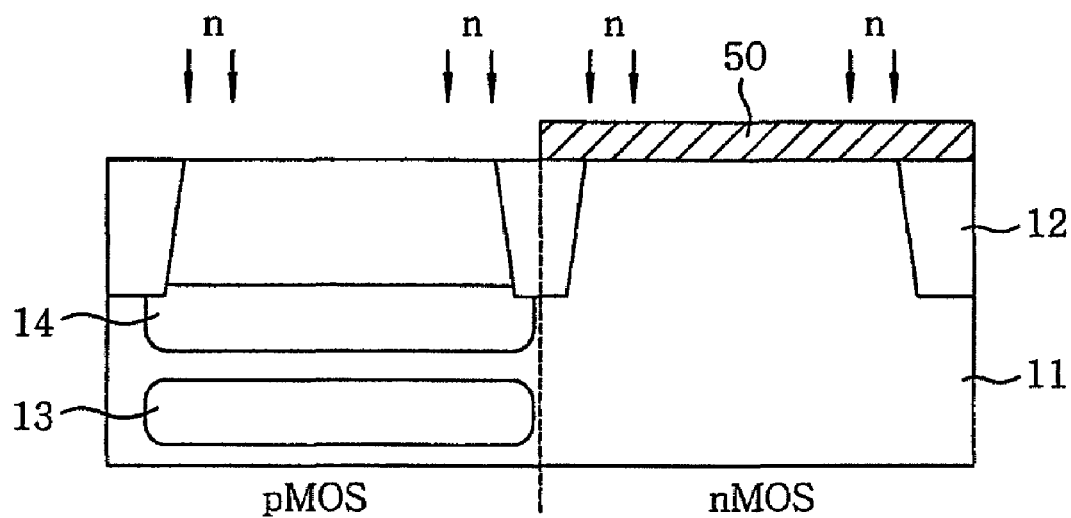
Figure 2B:
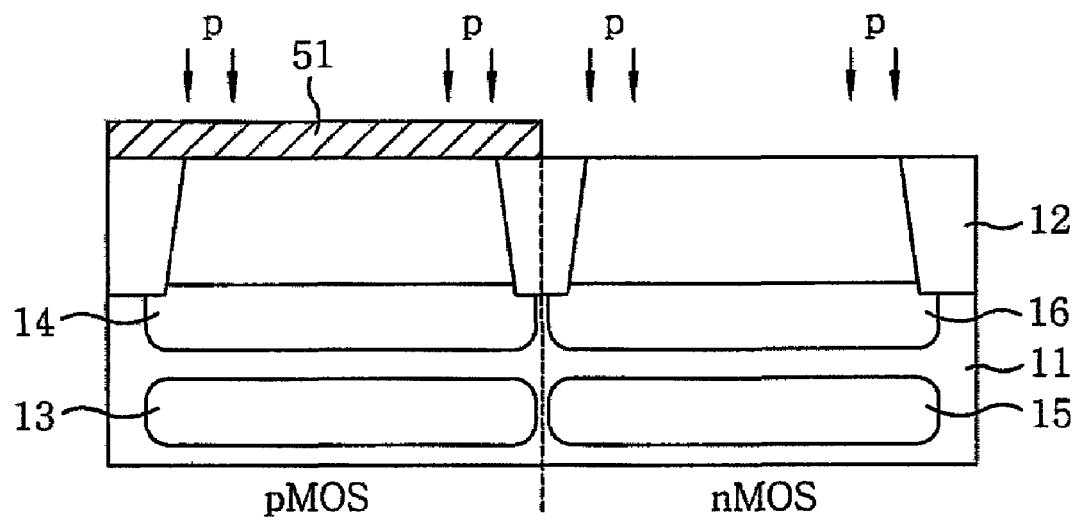
Figure 2C:
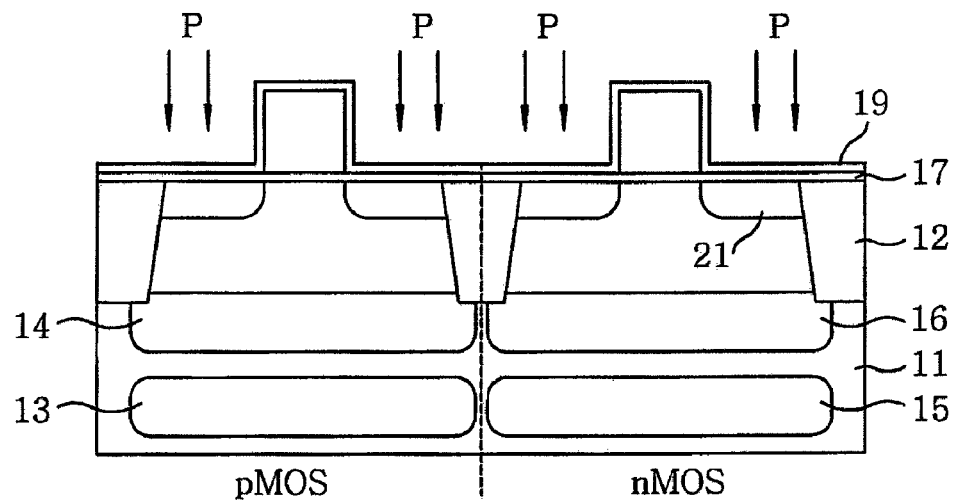

As illustrated in example FIG. 2a, STI regions 12 for isolating elements are formed in a semiconductor substrate 11. A photoresist may be coated over the semiconductor substrate 11 and may then be patterned by exposure and development, forming a first mask 50 through which a pMOS region may be opened. Phosphorus (P), or other n type impurity may be implanted into the pMOS region to form an n type well 13 and an n type field stop layer 14. The first mask 50 may be removed, and a photoresist may again be coated as illustrated in example FIG. 2b. The photoresist may be patterned by exposure and development to form a second mask 51 through which the nMOS region may be opened. A p type impurity may be implanted into the exposed nMOS region by employing the second mask 51, forming a p type well 15 and a p type field stop layer 16. The photoresists may be coated over the first mask 50 and the second mask 51 to a thickness of approximately 0.7 to 0.75 μm to be used as a DUV PR in 90 nm devices.

The second mask 51 may be removed. A gate oxide film 17, a gate 18, and a gate nitride film 19 may be formed over a selected region of the semiconductor substrate 11, as illustrated in example FIG. 2c. An n type impurity with a low concentration may be implanted over the entire surface by a blanket ion implant method, forming n type LDD regions 21 in the nMOS transistor region.

Figure 2D:
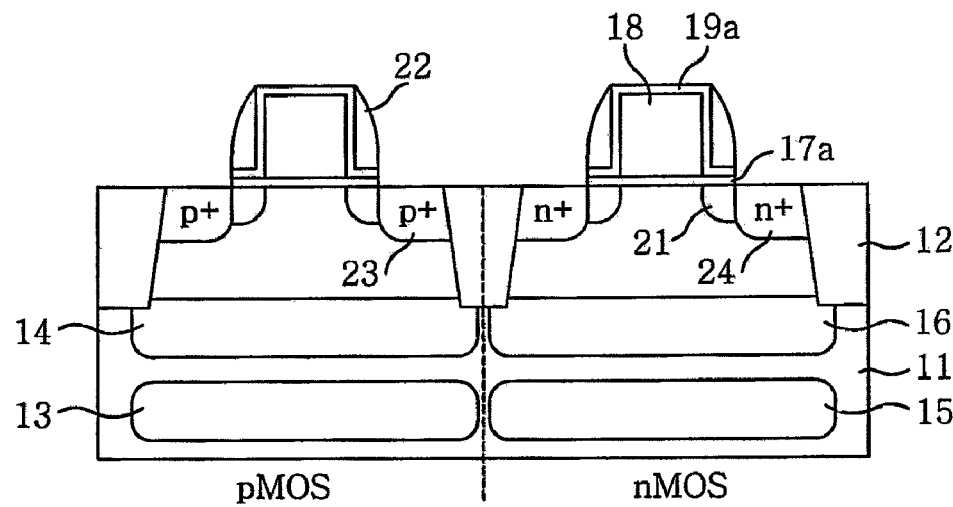

As illustrated in example FIG. 2d, after an oxide film is deposited over the entire surface, an etch-back process is performed to form a sidewall spacer 22 over the sidewalls of the gate electrodes 18. The gate the nitride film 19 and the gate oxide film 17 may be etched back at the same time. A p type impurity with a high concentration may then be implanted into the semiconductor substrate of the pMOS transistor region to form p type source/drain regions 23. An n type impurity of a high concentration may be implanted into the semiconductor substrate of the NMOS transistor region to form n type source/drain regions 24.

As described above, the DUV PR may be formed with a thickness of approximately 0.7 to 0.75 µm. To obtain a DUV PR with a precise thickness, several implant conditions may be implemented. A SIMS analysis may be used to determine whether the PR thickness has been obtained. An embodiment of the DUV PR having a thickness of approximately 0.7 µm is listed in the following table.

TABLE 1

| | Implant Condition | | | | | | | | | |
|---|---|---|---|---|---|---|---|---|---|---|
| | Dopant | Energy | Dose | Tilt/Twist | 7 | 8 | 9 | 10 | 11 | 12 |
| LDD | 11B+ | 10 | 5.00E+15 | 0/0 | | | | | | |
| PR | 11B+ | 30 | | 0/0 | | | | | | |
| 0.75 | 49BF2+ | 50 | | 0/0 | | | | | | |
| µm | 31P+ | 15 | | 0/0 | | | | | | |
| | 31P+ | 30 | | 0/0 | | | | | | |
| | 31P+ | 60 | | 0/0 | | | | | | |
| | SIMS | | | | 11B | 11B | 49BF2 | 31P | 31P | 31P |

Table 1 illustrates implant split conditions for evaluating the LDD implant PR 0.7 µm. Example FIG. 3 illustrates test SIMS results of implant split conditions according to embodiments. Example FIG. 3 illustrates PR thickness margins as SIMS results depending on changes in the implant process. In the case where several implant state conditions of the table are substituted, in the case of the LDD DUV approximately 0.7 µm PR, there were no problems as the barrier with respect to a dopant 11B+ used as the pMOS LDD, and approximately 30 KeV or less, (where, PR Top Loss approximately 250 nm or less), and there were no problems as the barrier with respect to a dopant 31P+ used as the nMOS LDD and approximately 30 KeV or less (where PR Top Loss approximately 300 nm or less).

As described above, according embodiments, as devices shift towards 90 nm processes, the PR process also switches from MUV to DUV. To follow the smaller design rules, a PR thickness suitable for 90 nm devices can be obtained through several implant conditions and SIMS analysis while switching to a DUV PR.

According to embodiments, as the size of devices shift to 90 nm, the photoresist process may also switch from MUV to DUV. In order to follow the smaller design rules, a switch to DUV may be required. A PR thickness appropriate for LDD implant conditions can be easily determined through SIMS results. Accordingly, time and cost savings may be realized in the development process.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an isolation film within a semiconductor substrate in which a pMOS region and an nMOS region are defined;
   forming a first mask to shield an NMOS region by using a deep ultraviolet photoresist having a thickness of approximately 0.7 to 0.75 µm, and implanting ions into the pMOS region to form a p type well;
   forming a second mask to shield the pMOS region by using a deep ultraviolet photoresist having a thickness of approximately 0.7 to 0.75 µm, and implanting ions into the nMOS region to form an n type well.

2. The method of claim 1, wherein the thickness of the deep ultraviolet photoresist is set based on an implant state condition and secondary ion mass spectrometry analysis.

3. The method of claim 2, wherein the implant state condition includes at least one of a dopant, energy, dose and tilt/twist variation information.

4. The method of claim 3, wherein the first mask is suitable as a barrier with respect to a dopant 11B+ at an energy of approximately 30 KeV or less.

5. The method of claim 3, wherein the first mask is used for a pMOS lightly doped drain.

6. The method of claim 3, wherein a top loss of the photoresist is approximately 250 nm or less.

7. The method of claim 3, wherein the first mask is suitable as a barrier with respect to a dopant 31P+ at an energy of approximately 30 KeV or less.

8. The method of claim 3, wherein the first mask is used as an nMOS lightly doped drain.

9. The method of claim 1, wherein the device method follows 90 nm design rules to form a 90 nm semiconductor device.

10. The method of claim 1, comprising forming a gate oxide film and a gate over the semiconductor substrate.

11. The method of claim 10, comprising implanting a low-concentration impurity by using the gate as a mask, forming a lightly doped drain region.

12. The method of claim 11, comprising forming a sidewall spacer over both sidewalls of the gate.

13. The method of claim 12, comprising implanting a high-concentration impurity by using the sidewall spacer as a mask, forming a source/drain region.

14. The method of claim 1, comprising forming a p type field stop layer in the nMOS region.

15. The method of claim 1, comprising forming an n type field stop layer in the pMOS region.

16. An apparatus comprising:

an isolation film formed within a semiconductor substrate in which a pMOS region and an nMOS region are defined;

a p type well formed by implanting ions into the pMOS region after forming a first mask to shield the nMOS region by using a deep ultraviolet photoresist having a thickness of approximately 0.7 to 0.75 μm;

an n type well formed by implanting ions into the NMOS region after forming a second mask to shield the pMOS region by using a deep ultraviolet photoresist having a thickness of approximately 0.7 to 0.75 μm.

17. The apparatus of claim 16, comprising a gate oxide film and a gate formed over the semiconductor substrate.

18. The apparatus of claim 17, comprising a lightly doped drain region formed by implanting a low-concentration impurity by using the gate as a mask.

19. The apparatus of claim 18, comprising a sidewall spacer formed over both sidewalls of the gate.

20. The apparatus of claim 19, comprising a source/drain region formed by implanting a high-concentration impurity by using the sidewall spacer as a mask.

* * * * *